(12) United States Patent
Haque et al.

(10) Patent No.: US 10,379,663 B2
(45) Date of Patent: Aug. 13, 2019

(54) APPARATUS AND METHOD FOR SENSING

(71) Applicant: Nokia Technologies Oy, Espoo (FI)

(72) Inventors: Samiul Haque, Cambridge (GB); Alan Colli, Cambridge (GB); Salvatore Zarra, Cambridge (GB); Stefano Borini, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/554,880

(22) PCT Filed: Feb. 22, 2016

(86) PCT No.: PCT/FI2016/050110
§ 371 (c)(1),
(2) Date: Aug. 31, 2017

(87) PCT Pub. No.: WO2016/139393
PCT Pub. Date: Sep. 9, 2016

(65) Prior Publication Data
US 2018/0046312 A1 Feb. 15, 2018

(30) Foreign Application Priority Data
Mar. 3, 2015 (EP) .................................. 15157356

(51) Int. Cl.
*G06F 3/041* (2006.01)
*G06F 3/044* (2006.01)
*H03K 17/96* (2006.01)
*H03K 17/94* (2006.01)
(Continued)

(52) U.S. Cl.
CPC .......... *G06F 3/0416* (2013.01); *G06F 1/3262* (2013.01); *G06F 3/044* (2013.01);
(Continued)

(58) Field of Classification Search
CPC ...... G06F 3/0416; G06F 1/3262; G06F 3/044; G06F 2203/04102; G06F 3/0421;
(Continued)

(56) References Cited

U.S. PATENT DOCUMENTS 9,569,050 B2 * 2/2017 Backman ................ G06F 3/044
2006/0244733 A1 * 11/2006 Geaghan ................ G06F 3/041
345/173

(Continued)

FOREIGN PATENT DOCUMENTS

DE 102011075067 A1 11/2012
JP 2011242966 A 12/2011
(Continued)

*Primary Examiner* — Nitin Patel
*Assistant Examiner* — Amy Onyekaba
(74) *Attorney, Agent, or Firm* — Harrington & Smith

(57) ABSTRACT

An apparatus and method, the apparatus including a sensor array including a plurality of first sensors configured to detect a first attribute; at least one second sensor configured to detect a second attribute; wherein the at least one second sensor is configured such that, in response to detecting a trigger input including the second attribute the second sensor enables a first portion of the sensor array to be powered on while a second portion of the sensor array remains powered off.

12 Claims, 6 Drawing Sheets

Figure 1:
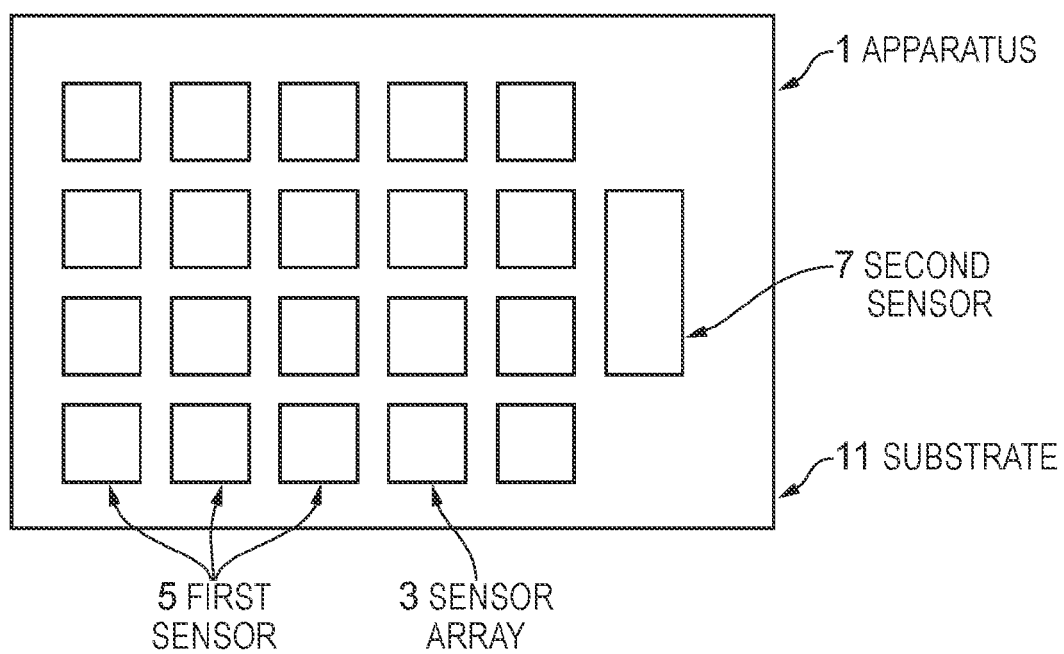

(51) Int. Cl.
*G06F 1/3234* (2019.01)
*G06F 3/042* (2006.01)

(52) U.S. Cl.
CPC ......... *G06F 3/0421* (2013.01); *H03K 17/941* (2013.01); *H03K 17/9622* (2013.01); *G06F 2203/04102* (2013.01)

(58) Field of Classification Search
CPC . G06F 2203/04106; G06F 2203/04101; G06F 2203/04105; G06F 3/0414; G06F 1/3265; G06F 3/045; H03K 17/9622; H03K 17/941; G02F 1/1343
See application file for complete search history.

(56) References Cited

U.S. PATENT DOCUMENTS

| | | | |
|---|---|---|---|
| 2008/0246723 A1 | 10/2008 | Baumbach | 345/156 |
| 2013/0062180 A1* | 3/2013 | Uenomachi | G06F 3/042 200/600 |
| 2013/0076712 A1* | 3/2013 | Zheng | G01J 1/32 345/207 |
| 2013/0126325 A1* | 5/2013 | Curtis | H03K 17/9622 200/5 A |
| 2014/0136867 A1* | 5/2014 | Yamamoto | G06F 1/3262 713/320 |
| 2014/0235123 A1 | 8/2014 | Lin et al. | 442/1 |
| 2014/0267137 A1* | 9/2014 | Solven | G06F 3/0416 345/174 |
| 2015/0155077 A1* | 6/2015 | Yamazaki | H01B 1/04 174/257 |
| 2015/0234446 A1* | 8/2015 | Nathan | G06F 1/3262 345/174 |
| 2018/0095560 A1* | 4/2018 | Hotelling | G06F 1/3231 |

FOREIGN PATENT DOCUMENTS

| | | |
|---|---|---|
| JP | 2015041160 A | 3/2015 |
| WO | WO2006/115946 A2 | 11/2006 |
| WO | WO 2008/085418 A2 | 7/2008 |

* cited by examiner

APPARATUS AND METHOD FOR SENSING

TECHNOLOGICAL FIELD

Examples of the disclosure relate to an apparatus and method for sensing. In particular, they relate to an apparatus and method for sensing user inputs.

BACKGROUND

Sensing apparatus are known. For example capacitive sensors may be used to detect user inputs in electronic devices.

However such sensors require large amounts of power. This can drain the power supply of an electronic device comprising such sensors. It is useful to reduce the power requirements of such sensors to provide more efficient apparatus and electronic devices.

BRIEF SUMMARY

Research leading to these results has received funding from the European Union Seventh Framework Programme under grant agreement no 604391 Graphene Flagship.

According to various, but not necessarily all, examples of the disclosure, there may be provided an apparatus comprising: a sensor array comprising a plurality of first sensors configured to detect a first attribute; at least one second sensor configured to detect a second attribute; wherein the at least one second sensor is configured such that, in response to detecting a trigger input comprising the second attribute the second sensor enables a first portion of the sensor array to be powered on while a second portion of the sensor array remains powered off.

In some examples the apparatus comprises a plurality of second sensors distributed throughout the sensor array. The plurality of second sensors may enable different portions of the sensor array to be powered on in response to different detected trigger inputs. The portion of the sensor array which is powered on in response to the detected trigger input may be positioned adjacent to the second sensor which has detected the trigger input.

In some examples the first sensors and the second sensors may be configured such that a first sensor requires more power than a second sensor to detect an attribute.

In some examples the at least one second sensor may form part of the first sensors.

In some examples the at least one second sensor may form at least part of an electrode of the first sensors.

In some examples the plurality of first sensors may comprise capacitive sensors.

In some examples the at least one second sensor may comprise infra red sensors.

In some examples the at least one second sensor may comprise reduced graphene oxide.

In some examples the at least one second sensors may be configured to detect a trigger input comprising a user bringing their finger close to the apparatus.

In some examples the apparatus may be flexible.

In some examples the at least one second sensor may be coupled to at least one switch to enable portions of the sensor array to be powered on and off.

According to various, but not necessarily all, examples of the disclosure, there may be provided a touch screen device comprising an apparatus as described above.

According to various, but not necessarily all, examples of the disclosure, there may be provided a method comprising: providing a sensor array comprising a plurality of first sensors configured to detect a first attribute; providing at least one second sensor configured to detect a second attribute; wherein the at least one second sensor is configured such that, in response to detecting a trigger input comprising the second attribute the second sensor enables a first portion of the sensor array to be powered on while a second portion of the sensor array remains powered off.

According to various, but not necessarily all, examples of the disclosure there may be provided examples as claimed in the appended claims.

BRIEF DESCRIPTION

Figure 2:
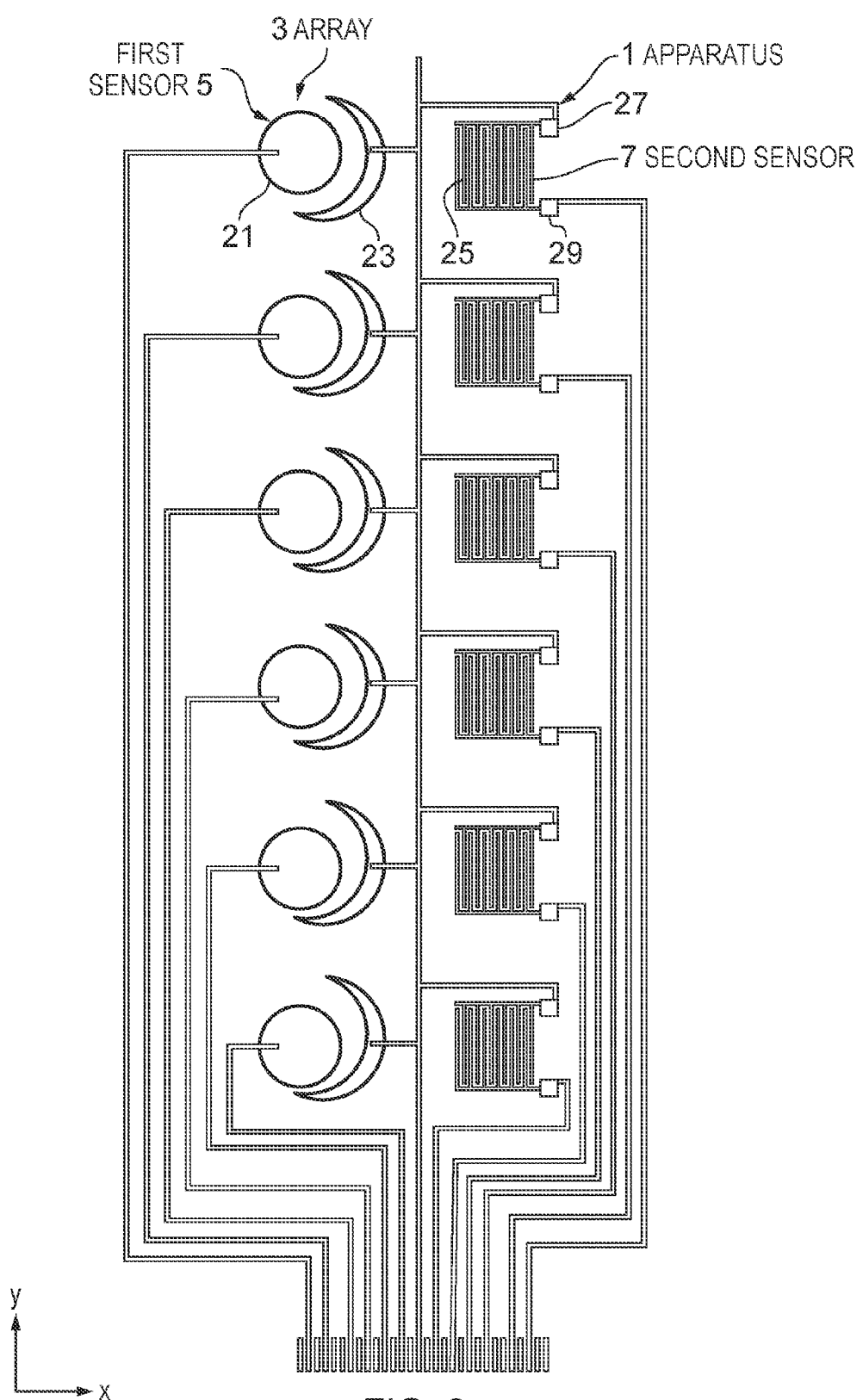
Figure 3:
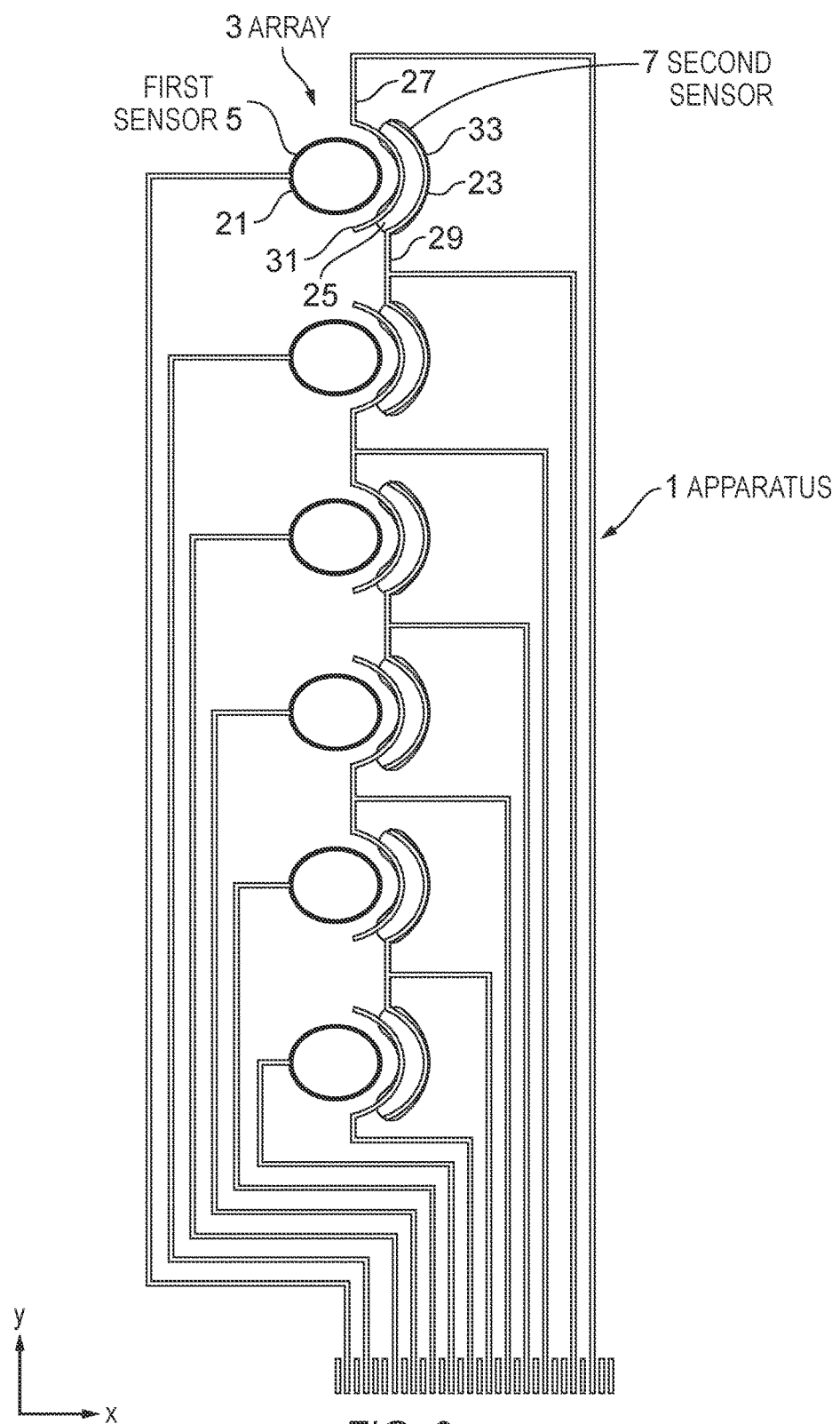
Figure 4:
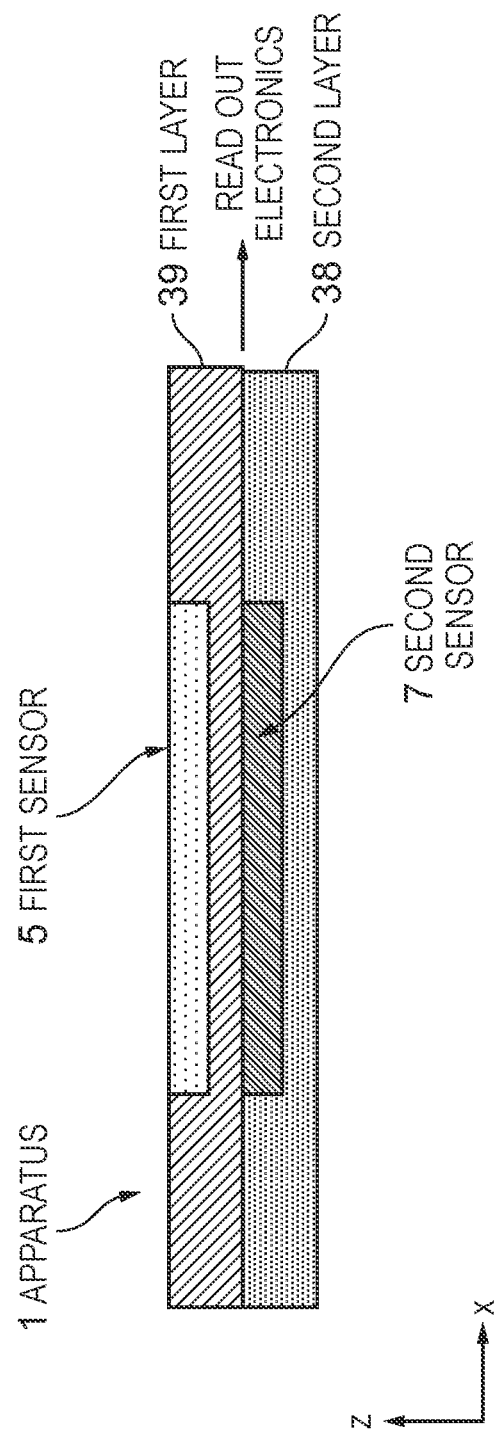
Figure 5:
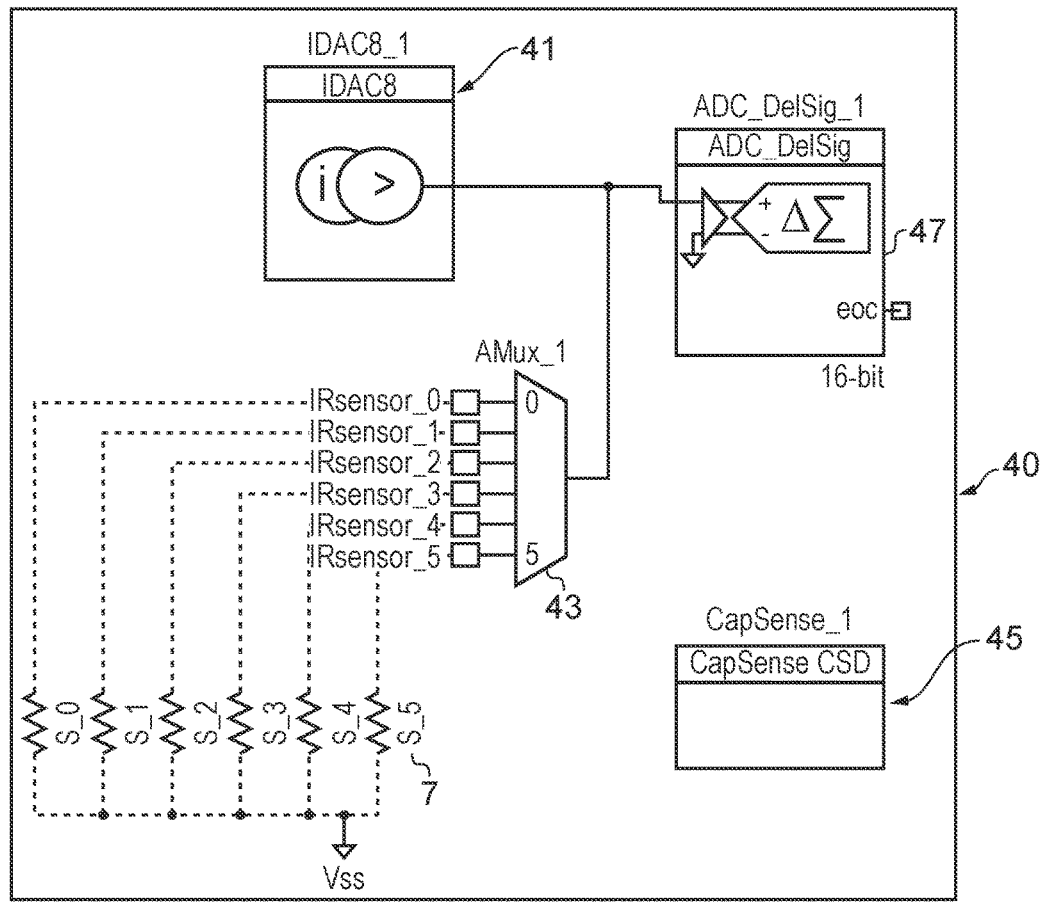
Figure 6:
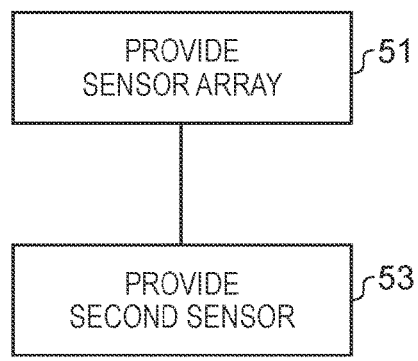
Figure 7A:
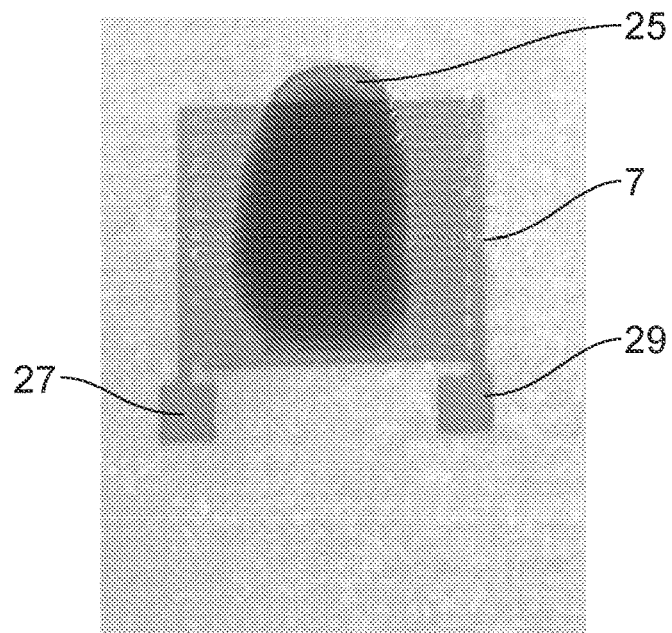
Figure 7B:
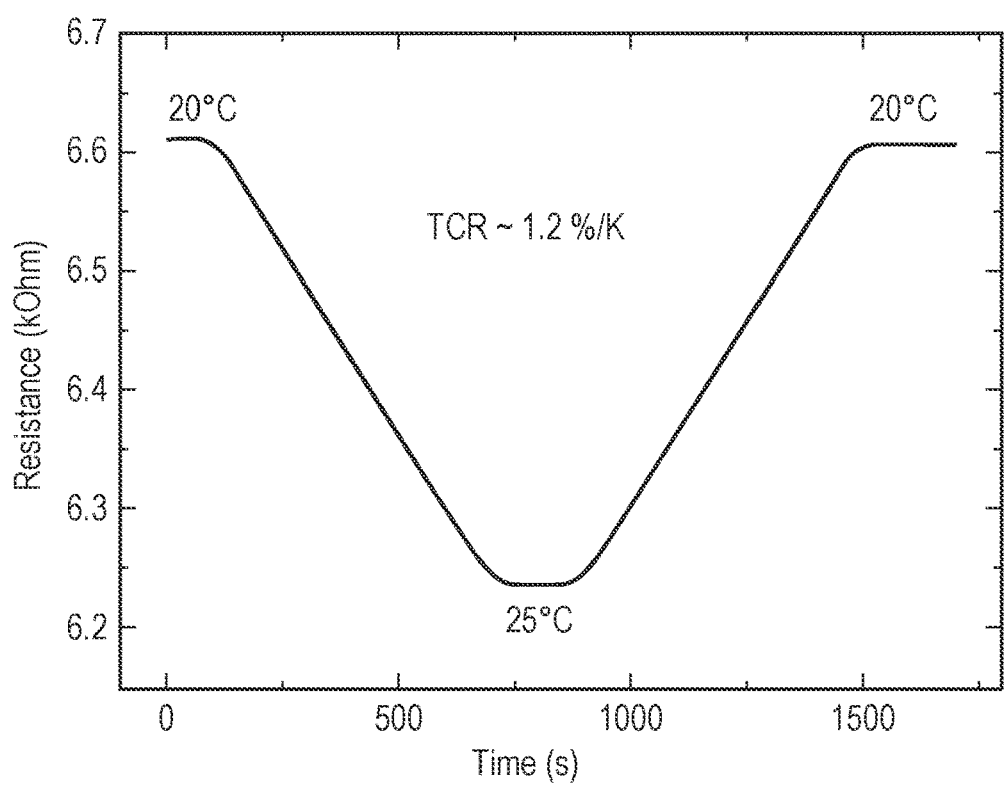

For a better understanding of various examples that are useful for understanding the detailed description, reference will now be made by way of example only to the accompanying drawings in which:

FIG. 1 illustrates an apparatus;
FIG. 2 illustrates an apparatus;
FIG. 3 illustrates an apparatus;
FIG. 4 illustrates an apparatus;
FIG. 5 illustrates read out electronics;
FIG. 6 illustrates a method; and
FIGS. 7A and 7B illustrate an example sensor and data obtained with a sample sensor.

DETAILED DESCRIPTION

The Figures illustrate an apparatus 1 comprising: a sensor array 3 comprising a plurality of first sensors 5 configured to detect a first attribute; at least one second sensor 7 configured to detect a second attribute; wherein the at least one second sensor 7 is configured such that, in response to detecting a trigger input comprising the second attribute the second sensor 7 enables a first portion of the sensor array 3 to be powered on while a second portion of the sensor array 3 remains powered off.

Examples of the disclosure provide the technical effect of reducing the power requirements of a sensor array 3. As only a first portion of the sensor array 3 is powered on in response to the detected trigger input this enables some portions of the sensor array 3 to remain powered off. This may enable only the portions of the sensor array 3 which are needed to detect an input to be powered on at any one time. This may reduce the power requirements of the sensor array 3.

The apparatus 1 may be for sensing. In some examples the apparatus 1 may be for sensing user inputs. In some examples the apparatus 1 may be provided with a touch screen or other user input device.

FIG. 1 schematically illustrates an example apparatus 1. The example apparatus 1 comprises a sensor array 3 comprising a plurality of first sensors 5. The apparatus 1 also comprises at least one second sensor 7.

The first sensors 5 may comprise any means which may be configured to detect a first attribute. The first sensors 5 may comprise active sensors 5 which may require a power input in order to enable the first attribute to be detected.

In some examples the first sensors 5 may comprise capacitive sensors. The attribute detected by such sensors may be a change in capacitance caused when a user brings their finger, or other suitable object, close to the apparatus 1. The capacitive sensors may be configured to detect events such as a user touching a device by detecting a change in mutual capacitance between two electrodes. It is to be appreciated that other types of sensors may be used in other examples of the disclosure.

In the example of FIG. 1 the plurality of first sensors 5 are arranged in an array 3. The sensor array 3 comprises a plurality of rows and a plurality of columns. In the example illustrated in FIG. 1 the sensor array 3 is a regular array comprising regularly spaced parallel rows and regularly spaced parallel columns. In the illustrated example, the sensor array 3 is orthogonal in that the rows are orthogonal to the columns. It is to be appreciated that in some examples the sensor array 3 might not be regular and/or might not be orthogonal. In the example of FIG. 1 the sensor array 3 comprises four rows and five columns. It is to be appreciated that different numbers of sensors and arrangements of the sensor array 3 may be used in other examples of the disclosure.

The apparatus 1 also comprises at least one second sensor 7. The at least one second sensor 7 may comprise any means which may be configured to detect a second attribute and provide a control signal indicative of the detected second attribute. The control signal may enable a first portion of the sensor array 3 to be powered on while a second portion of the sensor array 3 remains powered off.

In some examples the second sensor 7 may be configured to detect a different attribute to the first sensor. In some examples the at least one second sensor 7 may be configured to detect the same object or event as the first sensors 5. In such examples the first sensor 5 may be configured to detect a first attribute of the event or object while the second sensor 5 may be configured to detect a second attribute of the same event or object. For instance, in examples where the object which is sensed is a user's finger, the first sensors 5 may be configured to detect the change in capacitance while the second sensors 7 may be configured to detect infra red emitted by the finger or any other physical attribute of the finger. It is to be appreciated that other attributes and/or objects may be detected in other examples of the disclosure.

In some examples the at least one second sensor 5 may be a low power sensor. The at least one second sensor 5 may be a low power sensor compared to the first sensors 5. The first sensors 5 may require more power than a second sensor 7 to detect an attribute.

In the example of FIG. 1 only one second sensor 7 is illustrated. It is to be appreciated that any number of second sensors 7 may be provided in implementations of the disclosure. Each of the different second sensors 7 may be configured to enable a different portion of the sensor array 3 to be powered on and off. In some examples there may be provided a second sensor 7 for each first sensor 5 within the sensor array 3. In such examples the individual first sensors 5 within the sensor array 3 may be powered on and off independently of the other first sensors 5 within the sensor array 3. In other examples each second sensor 7 may be associated with a group of first sensors 5 within the sensor array 3.

In the example of FIG. 1 the second sensor 7 is positioned adjacent to the sensor array 3. The second sensor 5 may be positioned close enough to the sensor array 3 so that the same object or event can be detected by both the second sensor 5 and one or more of the first sensors within the sensor array 3. In some examples the second sensors 7 may be positioned within the sensor array 3. In some examples a plurality of second sensors 7 may be provided distributed throughout the array of first sensors 5. In such examples the plurality of second sensors 7 enable different portions of the sensor array 3 to be powered on in response to trigger inputs detected by different second sensors 7. The portion of the sensor array 3 which is powered on in response to a detected trigger input may be positioned adjacent to the second sensor 7 which has detected the trigger input.

In some examples the second sensor 7 may be positioned in the same layer as the sensor array 3. For instance, both the second sensor 7 and the sensor array 3 could be formed on the same surface of a substrate 11. In other examples the second sensor 7 could be positioned in a different layer to the sensor array 3. For instance, the second sensor 7 may be provided underneath the sensor array 3. In such examples the first sensors 5 may overlay the second sensor 7. One or more intervening layers may be provided between the first sensors 5 and the second sensor 7.

The sensor array 3 and the one or more second sensors 7 may be provided on a substrate 11. In some examples the substrate 11 may comprise a flexible substrate 11. The substrate 11 may comprise a flexible polymer material or any other suitable material.

In some examples the sensors 5, 7 may be coupled to one or more switches. The one or more switches may be configured to receive an input signal from the second sensor 7 and control the power supplied to respective portion of the sensor array in response to the input signal. The switches may comprise any suitable means such as a transistor or any other suitable switching device.

In some examples the one or more switches may be provided on the same substrate 11 as the sensors 5, 7. In other examples the one or more switches may be positioned on a different substrate. For instance where the substrate 11 is flexible the one or more switches may be provided on a different substrate which may be rigid.

The sensor array 3 and the one or more second sensors 7 may be formed using any suitable techniques. For instance, techniques such as drop casting or printing techniques may be used to form the first sensors 5 and the second sensors 7. The techniques which are used to form the sensors 5, 7 may depend on the materials which are used as sensing materials and as electrodes.

FIG. 2 illustrates another apparatus 1. The example apparatus 1 of FIG. 2 also comprises a sensor array 3 comprising a plurality of first sensors 5 and a plurality of second sensors 7.

In the example of FIG. 2 the first sensors 5 may be capacitive touch sensors. Each of the capacitive sensors 5 comprises a first electrode 21 and a second electrode 23. The first and second electrodes 21, 23 are positioned adjacent to each other but not touching each other. The first electrode 21 may be an active electrode. The active electrode 21 may be configured to be connected to a power source. The second electrode 23 may be a ground electrode. The first electrode 21 and the second electrode 23 may be configured so that the mutual capacitance between the two electrodes 21, 23 changes when a user brings their finger close to the sensor 5. The sensor 5 may be configured to provide an output signal indicative of the change in capacitance.

In the example of FIG. 2 the active electrode 21 is disc shaped and the ground electrode 23 is crescent shaped. Other shapes and configurations of electrodes 21, 23 may be used in other examples of the disclosure.

The electrodes 21, 23 may comprise any suitable conductive material. For instance the electrodes 21, 23 may comprise silver, gold, graphene, indium tin oxide (ITO) or any other suitable material.

In the example of FIG. 2 six first sensors 5 are provided. The six first sensors 5 are arranged in an array 3. In the example of FIG. 2 the sensor array 3 comprises a single column. It is to be appreciated that different numbers of sensors and arrangements of the sensor array 3 may be used in other examples of the disclosure.

The example apparatus 1 of FIG. 2 also comprises a plurality of second sensors 7. In the example of FIG. 2 the second sensors 7 may be infra red sensors which may be configured to detect a user's finger touching or in proximity to the apparatus 1.

In the example of FIG. 2 the second sensor 7 comprises a resistive sensor. The resistive sensor comprises a first electrode 27 and second electrode 29 and sensor material 25. The sensor material 25 forms an electrical connection between the electrodes 27, 29. The sensor material 25 may provide a direct current path between the two electrodes 27, 29.

The sensor material 25 may comprise a material which has a variable resistance. The sensor material 25 may have a resistive transduction mechanism so that the resistivity of the sensor material 25 changes in response to the attribute to be sensed. In the example of FIG. 2 the second sensor 7 is configured to detect infra red radiation emitted by a user's fingers so the sensor material 25 may comprise any material which has a resistance which varies in response to incident infra red radiation.

The sensor material 25 may comprise any material which has a temperature coefficient of resistance which is large enough to detect the change in temperature caused by the user's finger. In some examples the sensor material 25 may comprise reduced graphene oxide. Reduced graphene oxide has a temperature coefficient of resistance (TCR) which is large enough to enable it to be used to detect small changes in temperature. The reduced graphene oxide also provides benefits in that it may enable the second sensors 7 to be easily manufactured. For instance the reduced graphene oxide may be drop casted onto a substrate 11 to form the second sensor.

It is to be appreciated that other sensor materials 25 may be used in other examples of the disclosure. For instance Vanadium oxide or silicon based materials or any other suitable material may be used.

The electrodes 27 and 29 may comprise any conductive material. For examples the electrodes 27, 29 may comprise copper, silver, gold, graphene, indium tin oxide (ITO) or any other suitable material. In some examples the electrodes 27, 29 may be transparent.

In the example of FIG. 2 the electrodes 27, 29 are interdigitated electrodes. This may enable the length of the electrodes to be large relative to the distance between the electrodes. This configuration of electrodes 27, 29 may be used with sensor material 25 which has a high sheet resistance such as reduced graphene oxide.

In the example of FIG. 2 six second sensors 7 are provided. Each of the second sensors 7 is provided adjacent to a different first sensor 5. This may enable each of the first sensors 5 to be powered on individually in response to a trigger input being detected by the second sensor 7 adjacent to the first sensor 5.

When the apparatus 1 is in use the sensor array 3 may be initially powered off. For instance, a touch screen may be in a power saving mode. The sensor array 3 may be powered off so that all of the first sensors 5 within the array are powered off. When the first sensors 5 are powered off they may be configured so that they cannot detect the first attribute. In the example of FIG. 2 when the first sensors 5 are powered off the active electrodes 21 may be disconnected from the power source. However, each of the second sensors 7 may be active and configured to detect a trigger input. In the example of FIG. 2 the trigger input may comprise infra red radiation emitted by a user's finger as it is brought close to the apparatus 1.

In response to the detection of the trigger input the second sensor 7 provides a control signal to enable a portion of the sensor array 3 to be powered on. In the example of FIG. 2 the portion of the sensor array 3 which is powered on may comprise a single first sensor 5. In other examples the portion of the sensor array 3 may comprise a plurality of first sensors 5.

The trigger input may be detected by one second sensor 7 or by more than one second sensor 7. If the trigger input is detected by more than one second sensor 7 this may enable more than one portion of the sensor array 3 to be powered on.

The apparatus 1 may be configured so that the first sensors 5 which are positioned adjacent to or in proximity to the one or more second sensors 7 which have detected the trigger input are powered on. First sensors 5 which are not positioned adjacent to or in proximity to the one or more second sensors 7 which have detected the trigger input remain powered off. When the first sensors 5 are powered on they may be configured so that they can detect the first attribute. In the example of FIG. 2 when the first sensors 5 are powered on the active electrodes 21 may be connected to the power source.

The example apparatus 1 therefore enables trigger inputs to be detected by low power second sensors 7. In response to the trigger input portions of a sensor array 3 may be powered on while other portions may remain powered off. This may enable only portions of the sensor array 3 which are needed to detect attributes user input to be powered on which provides a more efficient sensor array.

FIG. 3 illustrates another apparatus 1 according to examples of the disclosure. The example apparatus 1 of FIG. 2 also comprises a sensor array 3 comprising a plurality of first sensors 5 and a plurality of second sensors 7. In the example of FIG. 3 the second sensors 7 are integrated within the first sensors 5 so that the second sensors 7 form part of the first sensors 5. In the example of FIG. 3 the second sensors 5 form at least part of an electrode of the first sensors.

In the example of FIG. 3 the first sensors 5 may be capacitive touch sensors comprising a first electrode 21 and a second electrode 23. The first electrode 21 may be an active electrode which may be as described above. In the example of FIG. 3 the first electrode is disc shaped.

The second electrode 23 of the first sensor is a ground electrode. In the example of FIG. 3 the ground electrode is crescent shaped. Other shapes of ground electrodes 23 may be used in other examples of the disclosure. For instance, the ground electrodes 23 could comprise a single line, a plurality of meshed lines or a square mesh structure which may be configured to act as a ground layer.

In the example of FIG. 3 the ground electrode 23 comprises a first conductive portion 31 and a second conductive portion 33 and a sensor material 25 provided between the conductive portions. This may enable the ground electrode 23 to function as a second sensor 7 in which the first conductive portion 31 and a second conductive portion 33 provide the electrode 27, 29 of the second sensor.

The sensor material 25 which is used may comprise reduced graphene oxide or any other suitable material as described above.

This arrangement may provide a single sensor which is configured to detect two different attributes.

In the example of FIG. 3 six first sensors 5 are provided. The six first sensors 5 are arranged in an array 3. In the examples of FIG. 2 the sensor array 3 comprises a single column. Each of the first sensors 5 comprises an electrode which functions as a second sensor 7. It is to be appreciated that different numbers of sensors and arrangements of the sensor array 3 may be used in other examples of the disclosure. For instance in some examples only some of the first sensors 5 may comprise an electrode which functions as a second sensor 7.

The apparatus 1 of FIG. 3 may function in a similar way to the apparatus of FIG. 2 so that when a user brings their finger close to the apparatus 1 this may be detected by one or more of the second sensors 7. The user's finger provides a trigger input which causes the second sensor 7 to provide a control signal to enable at least one of the first sensors 5 to be powered on. The apparatus 1 may be configured so that the first sensors 5 which comprise the second sensors 7 which have detected the trigger input are powered on. First sensors 5 which do not comprise a second sensor 7 which has detected a trigger input may remain powered off.

The example apparatus 1 of FIG. 3 enables the second sensors 7 to be integrated as part of the first sensors 5. As the second sensors 7 are part of the first sensors 5 this makes the sensor array 3 more accurate because the position of the user's finger relative to the first sensor 5 can be detected more accurately.

The example apparatus of FIG. 3 may reduce the number of contacts and connections which are needed. This may make the apparatus 1 simpler and easier to manufacture.

In the example of FIGS. 2 and 3 the second sensors 7 are provided adjacent to the first sensors 5. The sensors 5, 7 may be provided in the same layer. In some examples the sensors 5, 7 may be provided in the same horizontal plane as indicated by the x and y axis in FIGS. 2 and 3.

FIG. 4 illustrates another example apparatus 1 in which the first sensors 5 and the second sensors 7 may be provided in different layers. The example apparatus 1 of FIG. 4 comprises a first sensor 5 provided in a first layer 39 and a second sensor 7 provided in a second layer 38. It is to be appreciated that other numbers of layers may be provided in other examples of the disclosure. It is to be appreciated that only one first sensor 5 and only one second sensor 7 are illustrated in the example of FIG. 4 but that any number of each sensors 5, 7 may be provided in examples of the disclosure. The sensors 5, 7 may be connected to read out electronics.

In the example of FIG. 4 the first sensor 5 is provided in a different horizontal plane to the second sensor 7. The first layer 39 may be provided overlaying the second layer 38 so that the first sensor 5 and the second sensor 7 may be separated in the z direction. This enables the sensors 5, 7 to be provided in different horizontal planes.

The first layer 39 and the second layer 38 may comprise any suitable substrates on which the sensors 5, 7 may be mounted. In some examples the first layer 39 and the second layer 38 may comprise a flexible material such as a flexible polymer material or any other suitable material. The first layer 39 may be made of a different material to the second layer 38.

In the examples of FIG. 4 an infra red sensor, or other type of second sensor 7, is provided underlying a capacitive sensor, or other type of first sensor 5. The second sensor 7 may be underlying the first sensor 5 in that it is positioned directly underneath the first sensor 5. The second sensor 7 may be located in the same position as the first sensor 5 in the x and y directions but may be located in a different position in the z direction. It is to be appreciated that in other examples the first sensor 5 may be provided underlying the second sensor 7.

The examples of FIG. 4 may reduce the area of the apparatus 1. It may also provide for a more accurate sensor array 3 as the second sensor 7 may have the same or similar x-y coordinates to a corresponding first sensor 5.

FIG. 5 illustrates read out electronics 40 which may be used with example apparatus 1 such as the apparatus of FIGS. 1 and 2.

The example read out electronics 40 of FIG. 5 comprises a power source 41. The power source 41 may be configured to provide a current to each of the second sensors 7.

The example read out electronics 40 also comprises selection circuitry 43. Each of the second sensors 7 are connected to the selection circuitry 43. The selection circuitry 43 may comprise a multiplexer or any other suitable means.

The read out electronics 40 also comprises an analogue to digital converter 47 which is configured to convert the signal obtained from the selection circuitry 43 to a digital signal. The digital signal may be used to determine which first sensors 5 should be powered on.

A capacitive sensing chip 45 may be provided to detect touch inputs from the first sensors 5. The capacitive sensing chip 45 may be configured to convert the detected touch inputs to an output signal which may be used to control an electronic device.

It is to be appreciated that other read out electronics may be used in other examples of the disclosure.

FIG. 6 illustrates a method. The method of FIG. 6 may be used to provide apparatus 1 such as the apparatus 1 of FIGS. 1 to 3.

The method comprises providing, at block 51, a sensor array 3 comprising a plurality of first sensors 5 configured to detect a first attribute. The method also comprises, at block 53, providing at least one second sensor 7 configured to detect a second attribute. The at least one second sensor 7 is configured such that, in response to detecting a trigger input comprising the second attribute the second sensor 7 enables a first portion of the sensor array 3 to be powered on while a second portion of the sensor array 3 remains powered off.

The sensors may be formed using any suitable techniques. For instance in example apparatus 1 such as the apparatus of FIGS. 2 and 3 the second sensors may be assembled by printing metal electrodes onto a flexible substrate. A reduced graphene oxide ink may be deposited onto the metal electrodes. Any suitable deposition method may be used to deposit the reduced graphene oxide such as drop casting, ink-jet printing or any other suitable technique.

The method of assembly which is used may depend on the materials which are used to form the sensing material 25 and the electrodes.

FIGS. 7A and 7B illustrate an example sensor and data obtained with a sample sensor.

The example sensor of FIG. 7A comprises sensing material 25. In the example of FIG. 7A the sensing material 25 comprises a portion of reduced graphene oxide provided between two interdigitated silver electrodes 27, 29. Such sensors may be used as second sensors 7 in examples of the disclosure.

FIG. 7B shows data which was obtained using the sensor of FIG. 7A. The data was obtained by measuring the resistance of the sensor as the temperature is increased from 20° C. to 25° C. This shows that such sensors may be sensitive enough to detect a user's finger through infra red radiation. This may be sensitive enough to detect a user's finger when the user's finger is within 5 to 10 cm of the apparatus 1 or even closer to the apparatus 1.

It is to be appreciated that the thermal sensitivity of the sensor may depend on factors such as the thermal capacity of the substrate 11, the specific heat capacity of sensing material 25, the thickness of the sensing material and other factors. The apparatus 1 may be designed to take such factors into account and provide a sensor with sufficient thermal sensitivity.

Examples of the disclosure may provide a sensor array 3 which can be partially powered on in response to a trigger input detected by a low power sensor. As an example this could be used to provide a touch sensor which also detects infra red radiation from a user's body. This enables the infra red radiation from the user to be used to turn the touch sensors on.

Examples of the disclosure may also be used in other applications. For instance the apparatus 1 may be used to detect thermal variation for medical applications. In such examples the apparatus 1 may be part of a wearable device. Examples of the disclosure could be used in industries such as the automotive industry where it may be useful to detect the proximity of one or more objects.

In the above described examples the electrodes comprise a metal such as silver. In other examples the may comprise conductive graphene or silver or hybrid graphene/silver inks. In some examples the apparatus 1 may comprise graphene architectures where graphene acts as the electrodes and modified graphene acts the sensing layer and silver mixed with graphene provide the interconnections In this description the term coupled means operationally coupled and any number or combination of intervening elements can exist (including no intervening elements).

Where a structural feature has been described, it may be replaced by means for performing one or more of the functions of the structural feature whether that function or those functions are explicitly or implicitly described.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although examples of the present disclosure have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain examples, those features may also be present in other examples whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a sensor array comprising a plurality of capacitive sensors configured to detect a first attribute;
   at least one infra red sensor configured to detect a second attribute;
   wherein the at least one infra red sensor is configured such that, in response to detecting a trigger input comprising the second attribute the at least one infra red sensor enables a first portion of the sensor array to be powered on while a second portion of the sensor array remains powered off, and wherein the at least one infra red sensor forms part of an electrode of the capacitive sensors.

2. An apparatus as claimed in claim 1, wherein the apparatus comprises a plurality of infra red sensors distributed throughout the sensor array.

3. An apparatus as claimed in claim 2, wherein the plurality of infra red sensors enable different portions of the sensor array to be powered on in response to different detected trigger inputs.

4. An apparatus as claimed in claim 3, wherein the portion of the sensor array which is powered on in response to the detected trigger input is positioned adjacent to the infra red sensor which has detected the trigger input.

5. An apparatus as claimed in claim 1, wherein the plurality of capacitive sensors and the at least one infra red sensor are configured such that the plurality of capacitive sensor requires more power than the at least one infra red sensor to detect an attribute.

6. An apparatus as claimed in claim 1, wherein the at least one infra red sensor forms part of the capacitive sensors.

7. An apparatus as claimed in claim 1, wherein the at least one infra red sensor comprises reduced graphene oxide.

8. An apparatus as claimed in claim 1, wherein the at least one infra red sensors are configured to detect a trigger input comprising a user bringing their finger close to the apparatus.

9. An apparatus as claimed in claim 1, wherein the apparatus is flexible.

10. An apparatus as claimed in claim 1, wherein the at least one infra red sensor is coupled to at least one switch to enable portions of the sensor array to be powered on and off.

11. A touch screen device comprising an apparatus as claimed in claim 1.

12. A method comprising:
    providing a sensor array comprising a plurality of capacitive sensors configured to detect a first attribute;

providing at least one infra red sensor configured to detect a second attribute; wherein the at least one infra red sensor is configured such that, in response to detecting a trigger input comprising the second attribute the at least one infra red sensor enables a first portion of the sensor array to be powered on while a second portion of the sensor array remains powered off, and wherein the at least one infra red sensor forms part of an electrode of the capacitive sensors.

* * * * *